United States Patent
Jang et al.

(10) Patent No.: US 6,950,365 B2
(45) Date of Patent: Sep. 27, 2005

(54) SEMICONDUCTOR MEMORY DEVICE HAVING BITLINE COUPLING SCHEME CAPABLE OF PREVENTING DETERIORATION OF SENSING SPEED

(75) Inventors: Tae-seong Jang, Yongin (KR); Sung-ho Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 116 days.

(21) Appl. No.: 10/630,068

(22) Filed: Jul. 30, 2003

(65) Prior Publication Data

US 2004/0125662 A1 Jul. 1, 2004

(30) Foreign Application Priority Data

Dec. 28, 2002 (KR) ................................ 10-2002-0085866

(51) Int. Cl.[7] .............................................. G11C 11/00
(52) U.S. Cl. ...................... 365/226; 365/205; 365/207; 365/189.09; 365/196; 365/202
(58) Field of Search ............................ 365/189.09, 226, 365/205, 207, 196, 202

(56) References Cited

U.S. PATENT DOCUMENTS

| | | | | | |
|---|---|---|---|---|---|
| 5,822,237 | A | * | 10/1998 | Wilson et al. | ............... 365/145 |
| 5,917,748 | A | * | 6/1999 | Chi et al. | .................... 365/168 |
| 5,973,983 | A | * | 10/1999 | Hidaka | .................. 365/230.03 |
| 6,016,279 | A | * | 1/2000 | Chi | .............................. 365/203 |
| 6,261,964 | B1 | * | 7/2001 | Wu et al. | ..................... 438/705 |
| 6,426,905 | B1 | * | 7/2002 | Dennard et al. | ............. 365/204 |
| 6,452,833 | B2 | * | 9/2002 | Akita et al. | .................. 365/149 |
| 6,493,251 | B2 | * | 12/2002 | Hoya et al. | .................. 365/145 |
| 6,535,413 | B1 | * | 3/2003 | Abbott et al. | ................. 365/63 |
| 6,594,172 | B2 | * | 7/2003 | Abbott et al. | ................. 365/63 |
| 2002/0187648 | A1 | * | 12/2002 | Wu et al. | ..................... 438/745 |

FOREIGN PATENT DOCUMENTS

| KR | 1996-11207 | 8/1996 | ......... G11C/11/407 |
|---|---|---|---|
| KR | 02-78802 | 10/2002 | ....... G11C/11/4091 |

* cited by examiner

*Primary Examiner*—Viet Q. Nguyen
(74) *Attorney, Agent, or Firm*—Mills & Onello LLP

(57) ABSTRACT

A semiconductor memory device having a bitline coupling scheme capable of preventing sensing speed from lowering due to variations in an external power supply is provided. The semiconductor memory device includes a memory cell array which includes a plurality of memory cells, a bitline and a complementary bitline which are connected to the memory cell array, a coupling capacitor one end of which is connected to either the bitline or the complementary bitline and the other end of which a control signal is applied to, a bitline sensing amplifier which senses and amplifies a difference in the voltage between the bitline and the complementary bitline, and a control circuit which generate the control signal. Here, an internal power supply generated by dropping an external power supply applied from the outside of the semiconductor memory device is used as a power supply of the control circuit.

9 Claims, 4 Drawing Sheets

SEMICONDUCTOR MEMORY DEVICE HAVING BITLINE COUPLING SCHEME CAPABLE OF PREVENTING DETERIORATION OF SENSING SPEED

BACKGROUND OF THE INVENTION

This application claims the priority of Korean Patent Application No. 2002-85866, filed Dec. 28, 2002, in the Korean Intellectual Property Office, the contents of which are incorporated herein in their entirety by reference.

1. Field of the Invention

The present invention relates to a semiconductor memory device, and more particularly to a control circuit which controls a bitline coupling capacitor.

2. Description of the Related Art

As the integration density of semiconductor memory devices, such as DRAMs, increases, the area of memory cells decreases, and the capacitance of a storage capacitor in a DRAM memory cell, i.e., cell capacitance, also decreases, which affects the operational characteristics of the DRAM, such as sensing speed or refresh, and leads to deterioration of the DRAM's performance.

In general, in order to solve the aforementioned problems, a bitline coupling scheme has been used. FIG. 1 is a circuit diagram of a semiconductor memory device having a conventional bitline coupling scheme. Referring to FIG. 1, a bitline BL is connected to an end of a coupling capacitor 12, and a control signal PBLC is applied to the other end of the coupling capacitor 12. The bitline BL and a complementary bitline BLB are connected to a memory cell array 11 including memory cells MC0, ..., MCn. A sensing amplifier 13 senses a difference ΔVBL in the voltage between the bitline BL and the complementary bitline BLB and amplifies the voltage difference.

The control signal PBLC is generated by a control circuit 14. When the control signal PBLC has a logic value of '1', the coupling capacitor 12 connected to the bitline BL starts to operate so that the capacitance of a storage capacitor C in a memory cell MC, i.e., cell capacitance, increases.

The control circuit 14 includes a NAND gate ND1, which receives a block selection signal BI and a signal (PBLCE) enabling a bitline coupling scheme, and an inverter I1, which generates the control signal PBLC by inverting an output signal of the NAND gate ND1.

As shown in FIG. 1, however, in the conventional bitline coupling scheme, an external power supply VDD is applied to a source and a bulk of a PMOS transistor P1 of the inverter I1. Accordingly, as the level of the external power supply VDD increases, the voltage level of the control signal PBLC increases. Thus, in a case where data stored in the memory cell have a logic value of '1', the voltage difference ΔVBL between the bitline BL and the complementary bitline BLB increases. As a result, the sensing speed of the sensing amplifier 13 increases, and the performance of the semiconductor memory device improves.

On the other hand, if the data stored in the memory cell have a logic value of '0', the voltage difference ΔVBL between the bitline BL and the complementary bitline BLB decreases even when the level of the external power supply VDD increases. Accordingly, the sensing speed of the sensing amplifier 13 decreases, and the performance of the semiconductor memory device deteriorates.

SUMMARY OF THE INVENTION

The present invention provides a semiconductor memory device having a bitline coupling scheme, which does not decrease sensing speed even when the level of an external power supply varies.

The present invention also provides a semiconductor memory device, which is capable of enhancing sensing speed by improving the operational characteristics of a bitline coupling scheme with the use of a mode register set (MRS).

According to an aspect of the present invention, there is provided a semiconductor memory device. The semiconductor memory device includes a memory cell array which includes a plurality of memory cells, a bitline and a complementary bitline which are connected to the memory cell array, a coupling capacitor one end of which is connected to either the bitline or the complementary bitline and the other end of which a control signal is applied to, a bitline sensing amplifier which senses and amplifies a difference in the voltage between the bitline and the complementary bitline, and a control circuit which generate the control signal. An internal power supply generated by dropping an external power supply applied from the outside of the semiconductor memory device is used as a power supply of the control circuit.

Preferably, the internal power supply determines a 'high' active restoration level in restoring the bitline.

Preferably, the control circuit includes an inverter, which outputs the control signal, the internal power supply is applied to a source of a PMOS transistor of the inverter, and the external power supply is applied to a bulk of the PMOS transistor of the inverter.

Preferably, the control circuit includes an inverter, which outputs the control signal, and the internal power supply is applied to a source and a bulk of a PMOS transistor of the inverter.

Preferably, the internal power supply is used as a power supply of the bitline sensing amplifier.

According to another aspect of the present invention, there is provided a semiconductor memory device. The semiconductor memory device includes a memory cell array which includes a plurality of memory cells, a bitline and a complementary bitline which are connected to the memory cell array, a coupling capacitor one end of which is connected to either the bitline or the complementary bitline and the other end of which a control signal is applied to, a bitline sensing amplifier which senses and amplifies a difference in the voltage between the bitline and the complementary bitline, a switch circuit which varies a power supply of the control circuit in response to a plurality of power control signals, and a mode register set which generates the power control signals in response to a command applied from the outside of the semiconductor memory device.

Preferably, the switch circuit includes a first switch which provides a boosted voltage generated by boosting an external power supply applied from the outside as a power supply of the control circuit in response to activation of a first power control signal, a second switch which provides the external power supply as the power supply of the control circuit in response to activation of a second power control signal, a third switch which provides an internal power supply generated by dropping the external power supply as the power supply of the control circuit in response to activation of a third power control signal, and a fourth switch which provides another internal power supply generated by dropping the external power supply as the power supply of the control circuit in response to activation of a fourth power control signal.

Preferably, the control circuit includes an inverter, which outputs the control signal, and an output signal of the switch circuit is applied to a source and a bulk of a PMOS transistor of the inverter.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
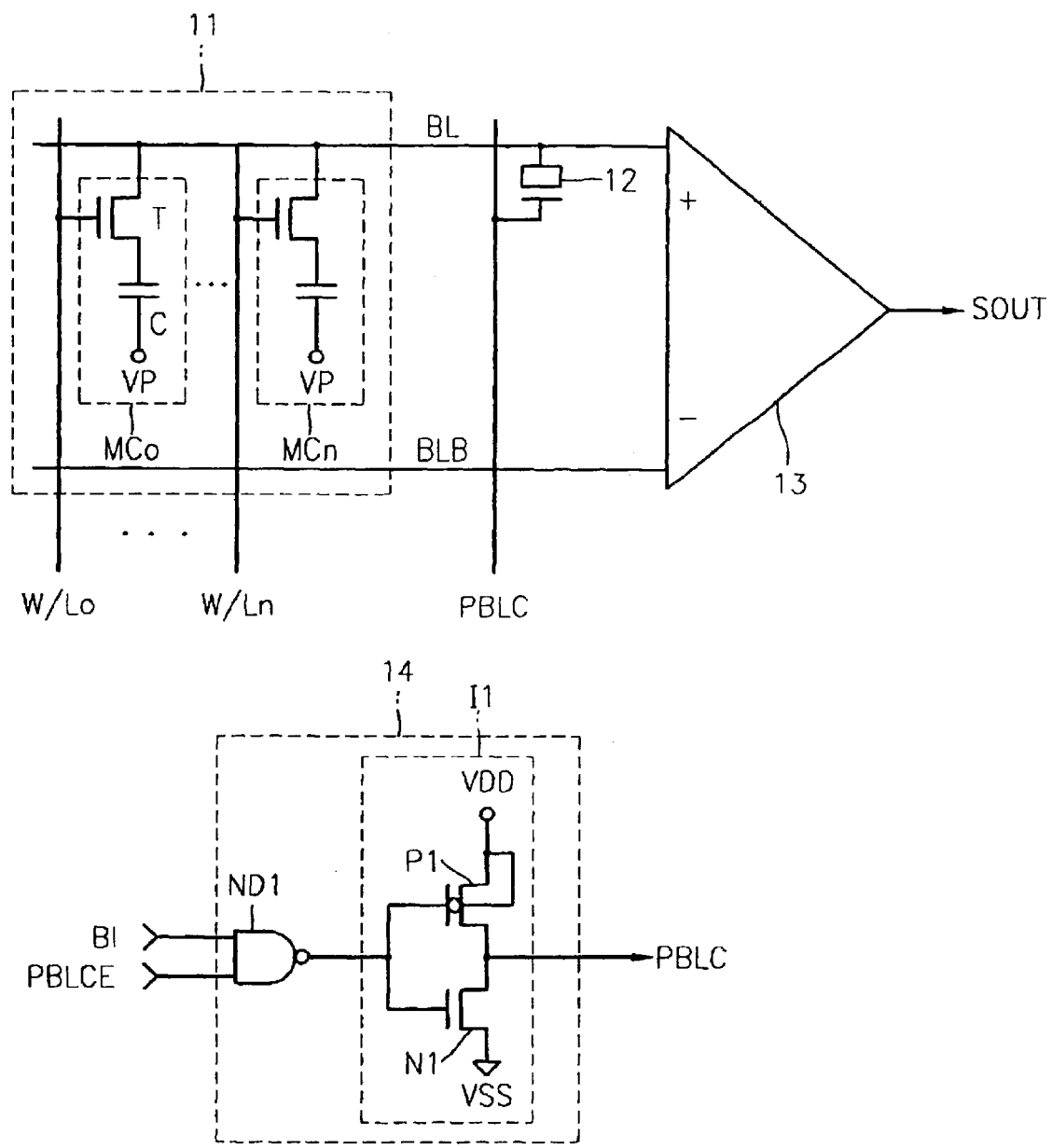
FIG. 1 is a circuit diagram of a semiconductor memory device having a conventional bitline coupling scheme.
Figure 2:
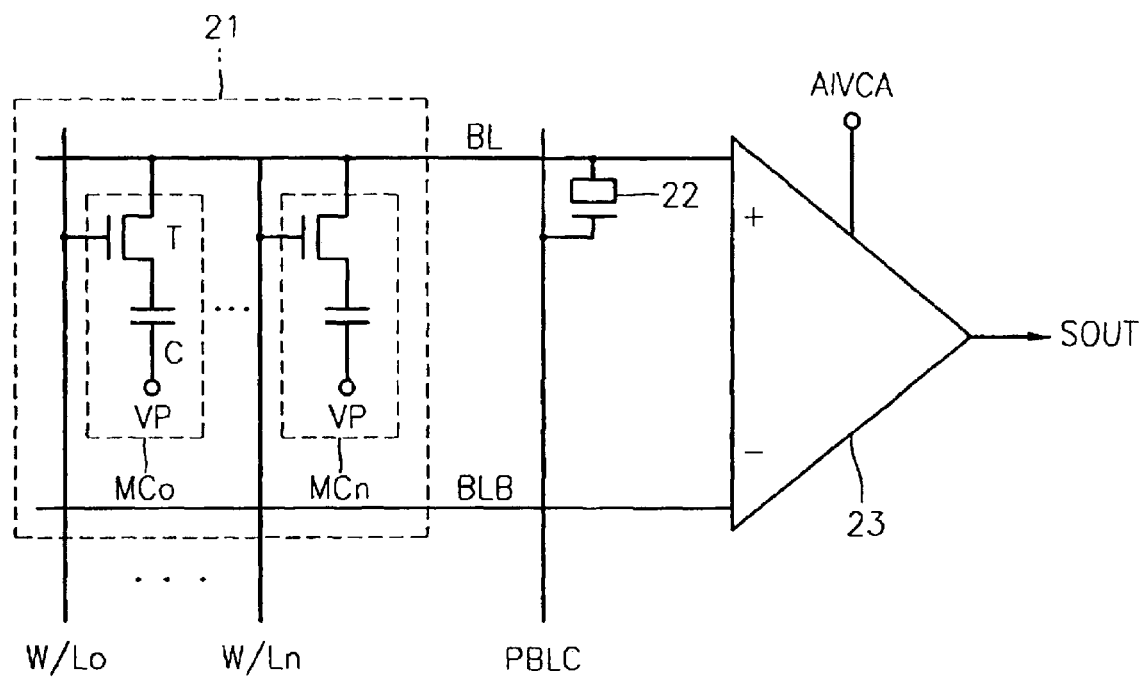
FIG. 2 is a circuit diagram of a semiconductor memory device having a bitline coupling scheme according to a preferred embodiment of the present invention.
Figure 2:
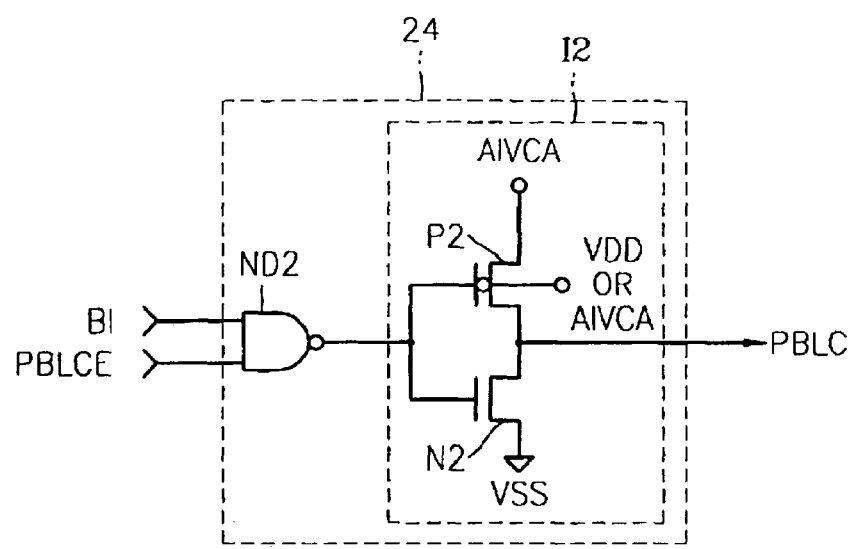

FIG. 2 is a circuit diagram of a semiconductor memory device having a bitline coupling scheme according to a preferred embodiment of the present invention. Referring to FIG. 2, a semiconductor memory device according to a preferred embodiment includes a memory cell array 21, which includes a plurality of memory cells MC0, . . . , MCn, a bitline BL, a complementary bitline BLB, a coupling capacitor 22, a bitline sensing amplifier 23, and a control circuit 24.

The bitline BL and the complementary bitline BLB are connected to the memory cell array 21. The bitline sensing amplifier 23 uses an internal power supply AIVCA as its power supply, and senses and amplifies a difference in the voltage between the bitline BL and the complementary bitline BLB. The internal power supply AIVCA is generated by an internal voltage generation circuit. The internal power supply AIVCA is a voltage generated by dropping the external power supply VDD applied from the outside. The internal power supply AIVCA is clamped at a predetermined level even though the level of the external power supply VDD increases.

The internal power supply AIVCA is used as a power supply of memory core circuits and determines a high active restoration level in restoring the bitline BL.

In order to increase cell capacitance, the coupling capacitor 22 is connected to the bitline BL. The bitline BL is connected to an end of the coupling capacitor 22, and a control signal PBLC is applied to the other end of the coupling capacitor 22. The control circuit 24 generates the control signal PBLC in response to a block selection signal BI and a signal PBLCE enabling a bitline coupling scheme. When the logic level of the control signal PBLC reaches '1', the coupling capacitor 22 connected to the bitline BL starts to operate, which leads to an effect that the capacitance of a storage capacitor C in the memory cell MC, i.e., cell capacitance, increases.

The control circuit 24 includes a NAND gate ND2, which receives the block selection signal BI and the signal PBLCE, and an inverter I2, which generates the control signal PBLC by inverting an output signal of the NAND gate ND2. In the present invention, the internal power supply AIVCA, which determines a high active restore level in restoring the bitline BL, is used as a power supply of the inverter I2. The internal power supply AIVCA is applied to a source and a bulk of a PMOS transistor P2 of the inverter I2.

Accordingly, even though the level of the external power supply VDD increases, a 'high' level of the control signal PBLC becomes the same as the level of the internal power supply AIVCA, which is clamped at a predetermined level. Thus, irrespective of whether data stored in a memory cell have a logic value of '1' or '0', a difference ΔVBL in the voltage between the bitline BL and the complementary bitline BLB is maintained at a predetermined level, and the performance of the sensing amplifier 23 can be prevented from deteriorating. That is, the performance of the semiconductor memory device can be prevented from deteriorating.

Instead of the internal power supply AIVCA, the external power supply VDD may be applied to the bulk of the PMOS transistor P2 of the inverter I2, in which case a forward bias can be prevented from occurring between the source and the bulk of the PMOS transistor P2 even when the internal power supply AIVCA increases abruptly.

Figure 3:
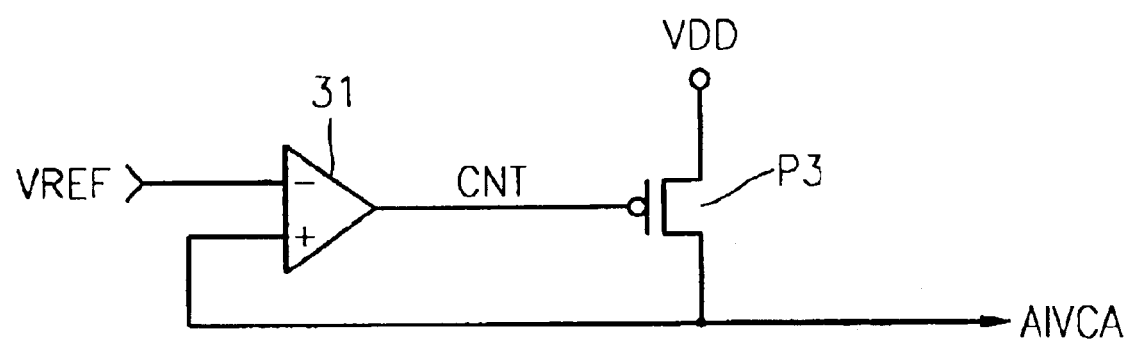
FIG. 3 is a circuit diagram of an example of an internal voltage generation circuit.
Figure 4:
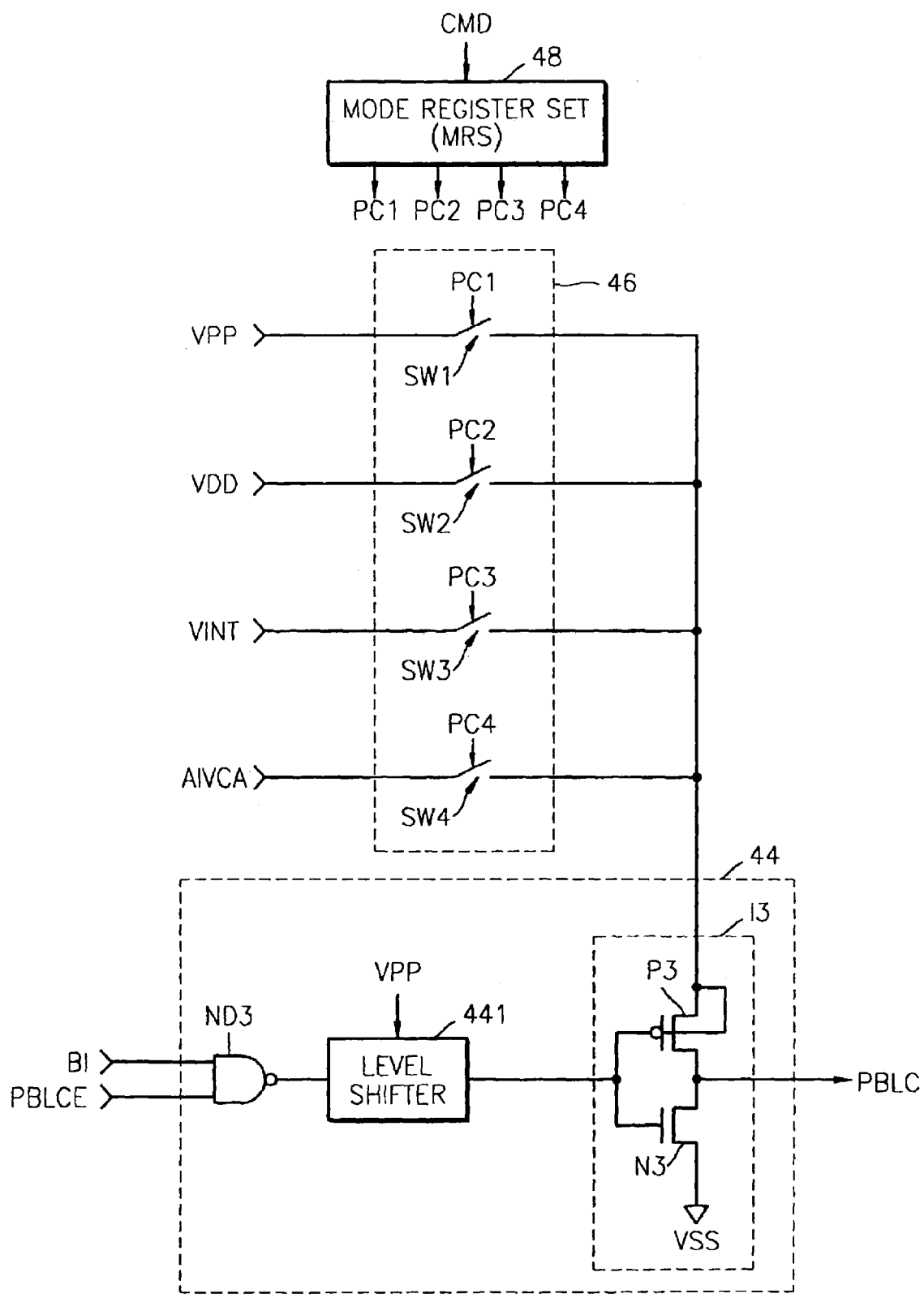
FIG. 4 is a diagram illustrating a process of varying power supply of a control circuit according to another preferred embodiment of the present invention using a mode register set (MRS).

FIG. 3 is a circuit diagram of an example of an internal voltage generation circuit. In general, an internal voltage generation circuit includes a driver P3 and a comparator 31. The driver P3 receives the external power supply VDD in response to a control signal CNT so as to drive the internal power supply AIVCA. The driver P3 is constituted by a PMOS transistor. The comparator 31 compares a reference voltage VREF and the internal power supply AIVCA and thus generates the control signal CNT FIG. 4 is a diagram illustrating a process of varying power supply of a control circuit according to another preferred embodiment of the present invention by using a mode register set (MRS). Referring to FIG. 4, a control circuit 44 includes a NAND gate ND3, which receives a block selection signal BI and a signal PBLCE, a level shifter 441, which shifts and outputs an output signal of the NAND gate ND3, and an inverter I3, which generates a control signal PBLC by inverting an output signal of the level shifter 441.

An output signal of a switch circuit 46 is used as a power supply of the inverter I3. The output signal of the switch circuit 46 is applied to a source and a bulk of a PMOS transistor P3 of the inverter I3.

Specifically, a mode register set (MRS) 48 generates a plurality of power control signals PC1 through PC4 in response to a command CMD applied from the outside. The switch circuit 46 varies a power supply of the inverter in the control circuit 44 in response to the power control signals PC1 through PC4.

The switch circuit 46 includes a plurality of switches SW1 through SW4. When the first power control signal PC1 is activated, the first switch SW1 is turned on, and a boosted voltage VPP is provided as a power supply of the inverter I3. When the second power control signal PC2 is activated, the second switch SW2 is turned on, and the external power supply VDD is provided as the power supply of the inverter I3. When the third power control signal PC3 is activated, the third switch SW3 is turned on, and an internal power supply VINT is provided as the power supply of the inverter I3. When the fourth power control signal PC4 is activated, the fourth switch SW4 is turned on, and the internal power supply voltage AIVCA is provided as the power supply of the inverter I3.

The internal power supply AIVCA is the same as those shown in FIGS. 2 and 3. The boosted voltage VPP is a voltage generated by boosting the external power supply VDD. The internal power supply VINT, like the internal power supply AIVCA, is generated by dropping the external power supply VDD and is clamped at a predetermined level even though the level of the external power supply VDD increases.

The level of a signal applied to a gate of the PMOS transistor P3 of the inverter I3 must be the same as or higher than the level of a power supply applied to the source of the PMOS transistor P3. For this, the boosted voltage VPP is used as a power supply of the level shifter 441.

As described above, in the case of using the circuit shown in FIG. 4, it is possible to improve the operational characteristics of a bitline coupling scheme by varying the power supply of the inverter I3 in the control circuit 44 using the mode register set 48.

In the semiconductor memory device having a bitline coupling scheme according to the present invention, the performance of a sensing amplifier, i.e., sensing speed, can be prevented from deteriorating even when the level of an external power supply increases. The performance of the semiconductor memory device can be prevented from deteriorating.

In addition, according to the present invention, it is possible to increase sensing speed and improve the operational characteristics of a bitline coupling scheme by varying the power supply of an inverter in a control circuit with the use of a mode register set (MRS).

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:
    a memory cell array which includes a plurality of memory cells;
    a bitline and a complementary bitline which are connected to the memory cell array;
    a coupling capacitor one end of which is connected to either the bitline or the complementary bitline and the other end of which a control signal is applied to;
    a bitline sensing amplifier which senses and amplifies a difference in the voltage between the bitline and the complementary bitline; and
    a control circuit which generate the control signal,
    wherein an internal power supply generated by dropping an external power supply applied from the outside of the semiconductor memory device is used as a power supply of the control circuit, wherein the internal power supply determines a 'high' active restoration level in restoring the bitline.

2. The semiconductor memory device of claim 1, wherein the control circuit comprises an inverter, which outputs the control signal, the internal power supply is applied to a source of a PMOS transistor of the inverter, and the external power supply is applied to a bulk of the PMOS transistor of the inverter.

3. The semiconductor memory device of claim 1, wherein the control circuit comprises an inverter, which outputs the control signal, and the internal power supply is applied to a source and a bulk of a PMOS transistor of the inverter.

4. The semiconductor memory device of claim 1, wherein the internal power supply is used as a power supply of the bitline sensing amplifier.

5. A semiconductor memory device comprising:
    a memory cell array which includes a plurality of memory cells;
    a bitline and a complementary bitline which are connected to the memory cell array;
    a coupling capacitor one end of which is connected to either the bitline or the complementary bitline and the other end of which a control signal is applied to;
    a bitline sensing amplifier which senses and amplifies a difference in the voltage between the bitline and the complementary bitline;
    a switch circuit which varies a power supply of the control circuit in response to a plurality of power control signals; and
    a mode register set which generates the power control signals in response to a command applied from the outside of the semiconductor memory device.

6. The semiconductor memory device of claim 5, wherein the switch circuit comprises:
    a first switch which provides a boosted voltage generated by boosting an external power supply applied from the outside as a power supply of the control circuit in response to activation of a first power control signal;
    a second switch which provides the external power supply as the power supply of the control circuit in response to activation of a second power control signal;
    a third switch which provides an internal power supply generated by dropping the external power supply as the power supply of the control circuit in response to activation of a third power control signal; and
    a fourth switch which provides another internal power supply generated by dropping the external power supply as the power supply of the control circuit in response to activation of a fourth power control signal.

7. The semiconductor memoxy device of claim 5, wherein the control circuit comprises an inverter, which outputs the control signal, and an output signal of the switch circuit is applied to a source and a bulk of a PMOS transistor of the inverter.

8. A semiconductor memory device comprising:

a memory cell array which includes a plurality of memory cells;

a bitline and a complementary bitline which are connected to the memory cell array;

a coupling capacitor one end of which is connected to either the bitline or the complementary bitline and the other end of which a control signal is applied to;

a bitline sensing amplifier which senses and amplifies a difference in the voltage between the bitline and the complementary bitline; and a control circuit which generate the control signal, wherein an internal power supply generated by dropping an external power supply applied from the outside of the semiconductor, memory device is used as a power supply of the control circuit; and wherein the control circuit comprises an inverter, which outputs the control signal, the internal power supply is applied to a source of a PMOS transistor of the inverter, and the external power supply is applied to a bulk of the PMOS transistor of the inverter.

9. A semiconductor memory device comprising:

a memory cell array which includes a plurality of memory cells;

a bitline and a complementary bitline which are connected to the memory cell array;

a coupling capacitor one end of which is connected to either the bitline or the complementary bitline and the other end of which a control signal is applied to;

a bitline sensing amplifier which senses and amplifies a difference in the voltage between the bitline and the complementary bitline; and a control circuit which generate the control signal, wherein an internal power supply generated by dropping an external power supply applied from the outside of the semiconductor memory device is used as a power supply of the control circuit; and wherein the control circuit comprises an inverter, which outputs the control signal, and the internal power supply is applied to a source and a bulk of a PMOS transistor of the inverter.

* * * * *

UNITED STATES PATENT AND TRADEMARK OFFICE
CERTIFICATE OF CORRECTION

PATENT NO. : 6,950,365 B2
DATED : September 27, 2005
INVENTOR(S) : Tae-seong Jang et al.

It is certified that error appears in the above-identified patent and that said Letters Patent is hereby corrected as shown below:

Column 7,
Line 24, delete "," after "semiconductor".

Signed and Sealed this

Thirty-first Day of January, 2006

JON W. DUDAS
*Director of the United States Patent and Trademark Office*